United States Patent
Zhang

(10) Patent No.: US 10,247,994 B2
(45) Date of Patent: Apr. 2, 2019

(54) PIXEL UNIT AND DRIVING METHOD THEREOF

(71) Applicant: Shenzhen China Star Optoelectronics Technology Co., Ltd., Shenzhen (CN)

(72) Inventor: Mengmeng Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/539,689

(22) PCT Filed: Apr. 11, 2017

(86) PCT No.: PCT/CN2017/080068
§ 371 (c)(1),
(2) Date: Jun. 25, 2017

(87) PCT Pub. No.: WO2018/157447
PCT Pub. Date: Sep. 7, 2018

(65) Prior Publication Data
US 2018/0373105 A1 Dec. 27, 2018

(30) Foreign Application Priority Data
Mar. 3, 2017 (CN) .......................... 201710124747

(51) Int. Cl.
*G09G 3/36* (2006.01)
*G02F 1/1362* (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC .......... G02F 1/136286; G02F 1/13624; G02F 1/13439; G02F 2201/122; G02F 2201/123;
(Continued)

(56) References Cited

U.S. PATENT DOCUMENTS

2008/0198285 A1 8/2008 Hsieh et al.
2011/0043718 A1 2/2011 Chin
(Continued)

FOREIGN PATENT DOCUMENTS

CN 104360556 A 2/2015
CN 104483792 A 4/2015
(Continued)

*Primary Examiner* — Premal R Patel
(74) *Attorney, Agent, or Firm* — Leong C. Lei

(57) ABSTRACT

The present invention provides a pixel unit and a driving method thereof. By electrically connecting the source of the charge sharing thin film transistor to the scan line corresponding to the next row of sub pixels of the sub pixel where the charge sharing thin film transistor is and setting the voltage level of the scan line corresponding to the next row of sub pixels to be the array substrate common voltage when the sub pixel is scanned, the main region and the sub region of the sub pixel have different voltage levels, and the additional arrangement of a line of the array substrate common voltage is not required. In comparison with prior art, the number of wires in the array substrate is reduced and the aperture ratio of the liquid crystal display panel is increased which facilitates the realization of the narrow frame of the liquid crystal display panel.

13 Claims, 5 Drawing Sheets

(51) Int. Cl.
*G02F 1/1368* (2006.01)
*G02F 1/1343* (2006.01)
*H01L 27/12* (2006.01)

(52) U.S. Cl.
CPC ......... *G09G 3/3607* (2013.01); *G09G 3/3648*
(2013.01); *G02F 1/13439* (2013.01); *G02F 1/134336* (2013.01); *G02F 2201/122* (2013.01); *G02F 2201/123* (2013.01); *G02F 2201/40* (2013.01); *G09G 2300/0465* (2013.01); *G09G 2300/0809* (2013.01); *G09G 2310/0202* (2013.01); *H01L 27/124* (2013.01)

(58) Field of Classification Search
CPC ............. G02F 1/1368; G02F 1/134336; G02F 2201/40; G09G 3/3648; G09G 3/3607; G09G 2310/0202; G09G 2300/0809; G09G 2300/0465; H01L 27/124
See application file for complete search history.

(56) References Cited

U.S. PATENT DOCUMENTS

2016/0018688 A1\* 1/2016 Huang ..................... G09G 3/36
349/38
2017/0047025 A1\* 2/2017 Yun ...................... G09G 3/3659

FOREIGN PATENT DOCUMENTS

CN         105280150 A    1/2016
CN         106249499 A    12/2016

\* cited by examiner providing a pixel unit, comprising: a plurality of sub pixels (10) arranged in array, a plurality of horizontal scan lines (20) which are in parallel spaced arrangement, a plurality of vertical data lines (30) which are in parallel spaced arrangement;
each row of sub pixels (10) corresponding to one scan line (20), and each column of sub pixels (10) corresponding to one data line (30), and each sub pixel (10) comprising: a main region thin film transistor (T1), a sub region thin film transistor (T2) and a charge sharing thin film transistor (T3);
n and m being set to be positive integers and in the sub pixel (10) of an nth row, a mth column: a gate of the main region thin film transistor (T1) being electrically coupled to a nth scan line (G(n)), and a source being electrically coupled to a mth data line (Data(m)), and a drain being electrically coupled to one end of a main region liquid crystal capacitor (C1);
a gate of the sub region thin film transistor (T2) being electrically coupled to the nth scan line (G(n)), and a source being electrically coupled to the mth data line (Data(m)), and a drain being electrically coupled to one end of a sub region liquid crystal capacitor (C2);
a gate of the charge sharing thin film transistor (T3) being electrically coupled to the nth scan line (G(n)), and a source being electrically coupled to a n+1th scan line (G(n+1)), and a drain being electrically coupled to one end of a sub region liquid crystal capacitor (C2);
both the other end of the main region liquid crystal capacitor (C1) and the other end of the sub region liquid crystal capacitor (C2) are electrically coupled to the color film substrate common voltage (Ccom);

— 1 sequentially scanning each row of sub pixels (10);
a scan process of each row of sub pixels: setting a row number of a currently scanned row of sub pixels (10) is the nth row, and the nth scan line (G(n)) providing a high voltage level (VGH), and the n+1th scan line (G(n+1)) providing an array substrate common voltage (Acom), and rest scan lines (20) providing low voltage levels (VGL), and all the main region thin film transistor (T1), the sub region thin film transistor (T2) and the charge sharing thin film transistor (T3) being activated, and the main region thin film transistor (T1) charging the main region liquid crystal capacitor (C1), and the sub region thin film transistor (T2) charging the sub region liquid crystal capacitor (C2), and the charge sharing thin film transistor (T3) discharging the sub region liquid crystal capacitor (C2) so that a voltage of two ends of the sub liquid crystal capacitor (C2) is lower than a voltage of two ends of the main region liquid crystal capacitor (C1).

PIXEL UNIT AND DRIVING METHOD THEREOF

FIELD OF THE INVENTION

The present invention relates to a display technology field, and more particularly to a pixel unit and a driving method thereof.

BACKGROUND OF THE INVENTION

The Liquid Crystal Display (LCD) is one of the most widely utilized flat panel displays, and the liquid crystal display panel is the core component of the Liquid Crystal Display. The liquid crystal display panel generally comprises a Color Filter (CF), a Thin Film Transistor Array Substrate (TFT Array Substrate) and a Liquid Crystal Layer arranged between the two substrates. Generally, the pixel electrode and the common electrode are respectively arranged on the array substrate and the color filter substrate. As the voltages are applied to the pixel electrodes and the common electrodes, the electrical field can be generated in the liquid crystal layer, and the electrical field determines the orientation of the liquid crystal molecules, and then to adjust the polarization of the light incident into the liquid crystal layer for making the liquid crystal display panel show images.

For enlarging the view angle, the pixel electrode is generally designed to be a pozidriv structure in prior art. The pixel electrode comprises the strip vertical trunk and strip horizontal trunk, and the centers of the vertical trunk and the horizontal trunk are perpendicularly intersecting. The center intersection means that the vertical trunk and the horizontal trunk are orthogonal, and the two equally split the area of the entire pixel electrode into 4 domains. Each pixel electrode region is composed with spread strip branches (Slit) appearing ±45°, ±135° angles with the vertical trunk or the horizontal trunk. The respective strip branches are positioned in the same plane where the vertical trunk and the horizontal trunk are to form the pozidriv pixel electrode structure, which are mirror symmetric up and down, left and right.

In such kind of the pozidriv pixel electrode structure, the strip branch in each pixel electrode region has the same included angle with the vertical trunk and the horizontal trunk, and therefore, a certain visual color difference or visual color deviation must exist, and the transmittance of the liquid crystal panel will drop. For improving the visual color difference or visual color deviation, the prior art is to divide one sub pixel into a main region and a sub region. One independent main region pixel electrode is positioned in the main region, and one independent sub region pixel electrode is positioned in the sub region. Both the main region pixel electrode and the sub region pixel electrode utilize the aforesaid pozidriv structure design. As shown in FIG. 1, each sub pixel comprising: a main region thin film transistor T100, a sub region thin film transistor T200, a charge sharing thin film transistor T300, a main region liquid crystal capacitor C100 and a sub region liquid crystal capacitor C200, and a gate of the main region thin film transistor T100 being electrically connected the scan line Gate corresponding to the pixel unit, and a source being electrically connected to the data line Data corresponding to the pixel unit, and the drain being electrically connected to one end of the main region liquid crystal capacitor C100, and a gate of the sub region thin film transistor T200 being electrically connected the scan line Gate corresponding to the pixel unit, and a source being electrically connected to the data line Data corresponding to the pixel unit, and the drain being electrically connected to one end of the sub region liquid crystal capacitor C200, and a gate of the charge sharing thin film transistor T300 being electrically connected the scan line Gate corresponding to the pixel unit, and a source being electrically connected to the array substrate common voltage Acom, and the drain being electrically connected to one end of the sub region liquid crystal capacitor C200, and both the other end of the main region liquid crystal capacitor C100 and the other end of the sub region liquid crystal capacitor C200 are electrically coupled to the color film substrate common voltage Ccom, and as working, the main region thin film transistor T100 charging the main region pixel electrode, and the sub region thin film transistor T200 charging the sub region pixel electrode, and the charge sharing thin film transistor T300 discharging the sub region pixel electrode so that main region and sub region produce different voltage levels to increase the view angle. However, in order to electrically connect the source of the charge sharing thin film transistor T300 to the array substrate common voltage Acom, it is necessary to provide an array substrate common voltage wire on the array substrate, which will reduce the aperture ratio of the liquid crystal display panel and increase the frame width of the liquid crystal display panel.

SUMMARY OF THE INVENTION

An objective of the present invention is to provide a pixel unit, which can increase the aperture ratio of the liquid crystal display panel and reduce the frame width of the liquid crystal display panel.

Another objective of the present invention is to provide a driving method of a pixel unit, which can increase the aperture ratio of the liquid crystal display panel and reduce the frame width of the liquid crystal display panel.

For realizing the aforesaid objective, the present invention provides a pixel unit, comprising: a plurality of sub pixels arranged in array, a plurality of horizontal scan lines which are in parallel spaced arrangement, a plurality of vertical data lines which are in parallel spaced arrangement;

each row of sub pixels corresponding to one scan line, and each column of sub pixels corresponding to one data line, and each sub pixel comprising: a main region thin film transistor, a sub region thin film transistor and a charge sharing thin film transistor;

n and m being set to be positive integers and in the sub pixel of an nth row, a mth column: a gate of the main region thin film transistor being electrically coupled to a nth scan line, and a source being electrically coupled to a mth data line, and a drain being electrically coupled to a main region pixel electrode;

a gate of the sub region thin film transistor being electrically coupled to the nth scan line, and a source being electrically coupled to the mth data line, and a drain being electrically coupled to a sub region pixel electrode;

a gate of the charge sharing thin film transistor being electrically coupled to the nth scan line, and a source being electrically coupled to a n+1th scan line, and a drain being electrically coupled to the sub region pixel electrode;

as the nth scan line provides a high voltage level, the n+1th scan line providing an array substrate common voltage, and rest scan lines providing low voltage levels.

The main region pixel electrode and a color film substrate common electrode collectively constitute a main region liquid crystal capacitor;

the sub region pixel electrode and the color film substrate common electrode collectively constitute a sub region liquid crystal capacitor.

Both the main region pixel electrode and the sub region pixel electrode are pozidriv structures, and both materials are ITO.

A gate of the main region thin film transistor, a gate of the sub region thin film transistor, a gate of the charge sharing thin film transistor and the scan lines are located in the first metal layer, and a source and a drain of the main region thin film transistor, a source and a drain of the sub region thin film transistor, a source and a drain of the charge sharing thin film transistor and the data lines are located in a second metal layer insulated from and stacked with the first metal layer.

A scanning direction of the pixel unit as driving is from a first row of sub pixels to a last row of sub pixels.

The present invention further provides a driving method of a pixel unit, comprising steps of:

step 1, providing a pixel unit, comprising: a plurality of sub pixels arranged in array, a plurality of horizontal scan lines which are in parallel spaced arrangement, a plurality of vertical data lines which are in parallel spaced arrangement;

each row of sub pixels corresponding to one scan line, and each column of sub pixels corresponding to one data line, and each sub pixel comprising: a main region thin film transistor, a sub region thin film transistor, a charge sharing thin film transistor, a main region liquid crystal capacitor and a sub region liquid crystal capacitor;

n and m being set to be positive integers and in the sub pixel of an nth row, a mth column: a gate of the main region thin film transistor being electrically coupled to a nth scan line, and a source being electrically coupled to a mth data line, and a drain being electrically coupled to one end of the main region liquid crystal capacitor;

a gate of the sub region thin film transistor being electrically coupled to the nth scan line, and a source being electrically coupled to the mth data line, and a drain being electrically coupled to one end of the sub region liquid crystal capacitor;

a gate of the charge sharing thin film transistor being electrically coupled to the nth scan line, and a source being electrically coupled to a n+1th scan line, and a drain being electrically coupled to the one end of the sub region liquid crystal capacitor;

both the other end of the main region liquid crystal capacitor and the other end of the sub region liquid crystal capacitor being electrically coupled to a color filter substrate common voltage;

step 2, sequentially scanning each row of sub pixels;

a scan process of each row of sub pixels: setting a row number of a currently scanned row of sub pixels is the nth row, and the nth scan line providing a high voltage level, and the n+1th scan line providing an array substrate common voltage, and rest scan lines providing low voltage levels, and all the main region thin film transistor, the sub region thin film transistor and the charge sharing thin film transistor being activated, and the main region thin film transistor charging the main region liquid crystal capacitor, and the sub region thin film transistor charging the sub region liquid crystal capacitor, and the charge sharing thin film transistor discharging the sub region liquid crystal capacitor so that a voltage of two ends of the sub liquid crystal capacitor is lower than a voltage of two ends of the main region liquid crystal capacitor.

One end of the main region liquid crystal capacitor is a main region pixel electrode and the other end is a common electrode;

one end of the sub region liquid crystal capacitor is a sub region pixel electrode and the other end is the common electrode.

Both the main region pixel electrode and the sub region pixel electrode are pozidriv structures, and both materials are ITO.

A gate of the main region thin film transistor, a gate of the sub region thin film transistor, a gate of the charge sharing thin film transistor and the scan lines are located in the first metal layer, and a source and a drain of the main region thin film transistor, a source and a drain of the sub region thin film transistor, a source and a drain of the charge sharing thin film transistor and the data lines are located in a second metal layer insulated from and stacked with the first metal layer.

A scanning direction of the pixel unit is from a first row of sub pixels to a last row of sub pixels.

The present invention further provides a driving method of a pixel unit, comprising steps of:

step 1, providing a pixel unit, comprising: a plurality of sub pixels arranged in array, a plurality of horizontal scan lines which are in parallel spaced arrangement, a plurality of vertical data lines which are in parallel spaced arrangement;

each row of sub pixels corresponding to one scan line, and each column of sub pixels corresponding to one data line, and each sub pixel comprising: a main region thin film transistor, a sub region thin film transistor, a charge sharing thin film transistor, a main region liquid crystal capacitor and a sub region liquid crystal capacitor;

n and m being set to be positive integers and in the sub pixel of an nth row, a mth column: a gate of the main region thin film transistor being electrically coupled to a nth scan line, and a source being electrically coupled to a mth data line, and a drain being electrically coupled to one end of the main region liquid crystal capacitor;

a gate of the sub region thin film transistor being electrically coupled to the nth scan line, and a source being electrically coupled to the mth data line, and a drain being electrically coupled to one end of the sub region liquid crystal capacitor;

a gate of the charge sharing thin film transistor being electrically coupled to the nth scan line, and a source being electrically coupled to a n+1th scan line, and a drain being electrically coupled to the one end of the sub region liquid crystal capacitor;

both the other end of the main region liquid crystal capacitor and the other end of the sub region liquid crystal capacitor being electrically coupled to a color filter substrate common voltage;

step 2, sequentially scanning each row of sub pixels;

a scan process of each row of sub pixels: setting a row number of a currently scanned row of sub pixels is the nth row, and the nth scan line providing a high voltage level, and the n+1th scan line providing an array substrate common voltage, and rest scan lines providing low voltage levels, and all the main region thin film transistor, the sub region thin film transistor and the charge sharing thin film transistor being activated, and the main region thin film transistor charging the main region liquid crystal capacitor, and the sub region thin film transistor charging the sub region liquid crystal capacitor, and the charge sharing thin film transistor discharging the sub region liquid crystal capacitor so that a voltage of two ends of the sub liquid crystal capacitor is lower than a voltage of two ends of the main region liquid crystal capacitor;

wherein one end of the main region liquid crystal capacitor is a main region pixel electrode and the other end is a color film substrate common electrode;

one end of the sub region liquid crystal capacitor is a sub region pixel electrode and the other end is the color film substrate common electrode;

wherein a scanning direction of the pixel unit as driving is from a first row of sub pixels to a last row of sub pixels.

The benefits of the present invention are: the present invention provides a pixel unit. By electrically connecting the source of the charge sharing thin film transistor to the scan line corresponding to the next row of sub pixels of the sub pixel where the charge sharing thin film transistor is and setting the voltage level of the scan line corresponding to the next row of sub pixels to be the array substrate common voltage when the sub pixel is scanned, the main region and the sub region of the sub pixel have different voltage levels, and the additional arrangement of a line of the array substrate common voltage is not required. In comparison with prior art, the number of wires in the array substrate is reduced and the aperture ratio of the liquid crystal display panel is increased which facilitates the realization of the narrow frame of the liquid crystal display panel. The present invention further provides a driving method of a pixel unit, which can reduce the number of wires and the width of the frame in the array substrate and increase the aperture ratio of the liquid crystal display panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings,

FIG. 5 is a flowchart of a driving method of a pixel unit according to the present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
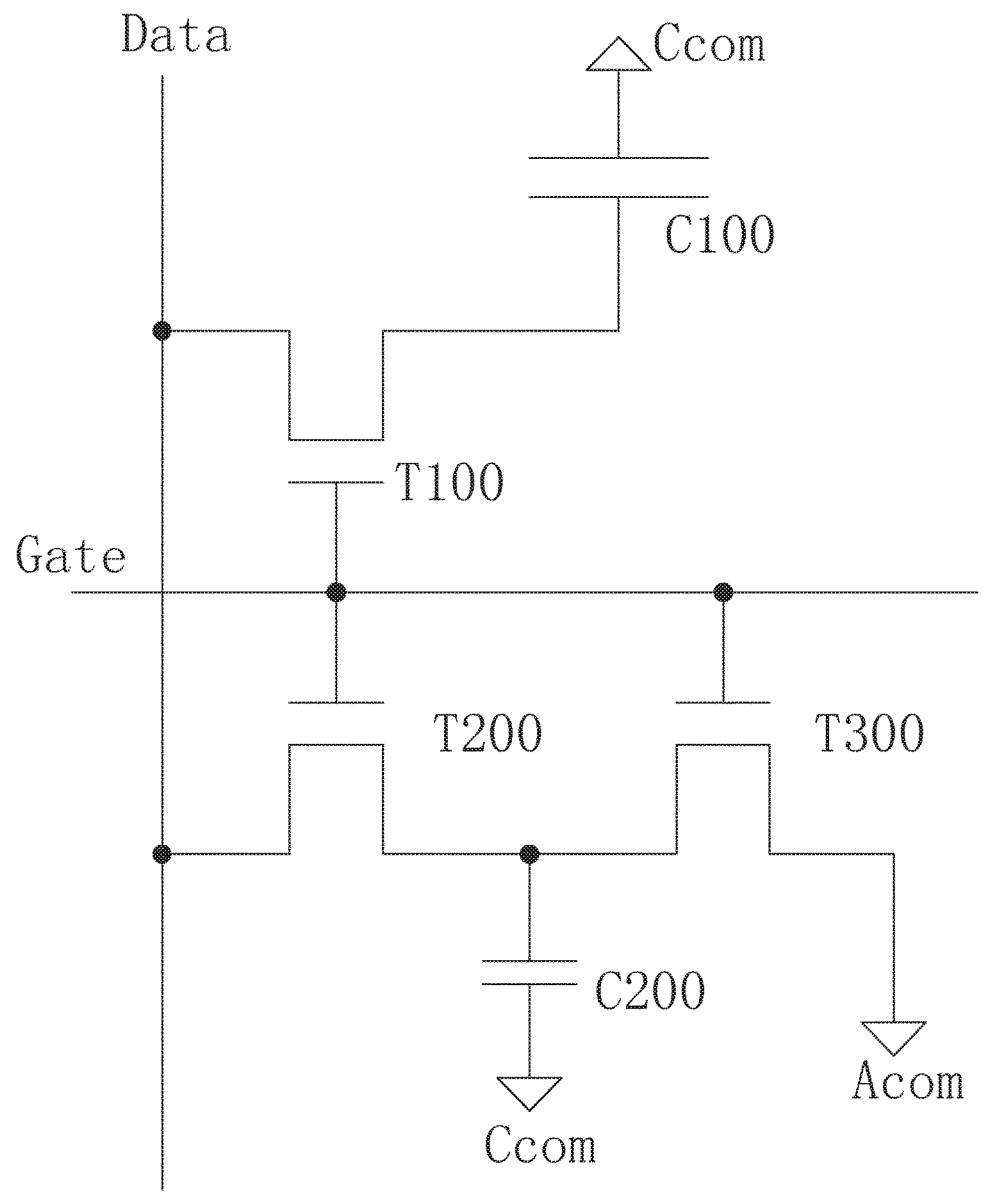
FIG. 1 is a circuit diagram of a pixel unit according to prior art.
Figure 2:
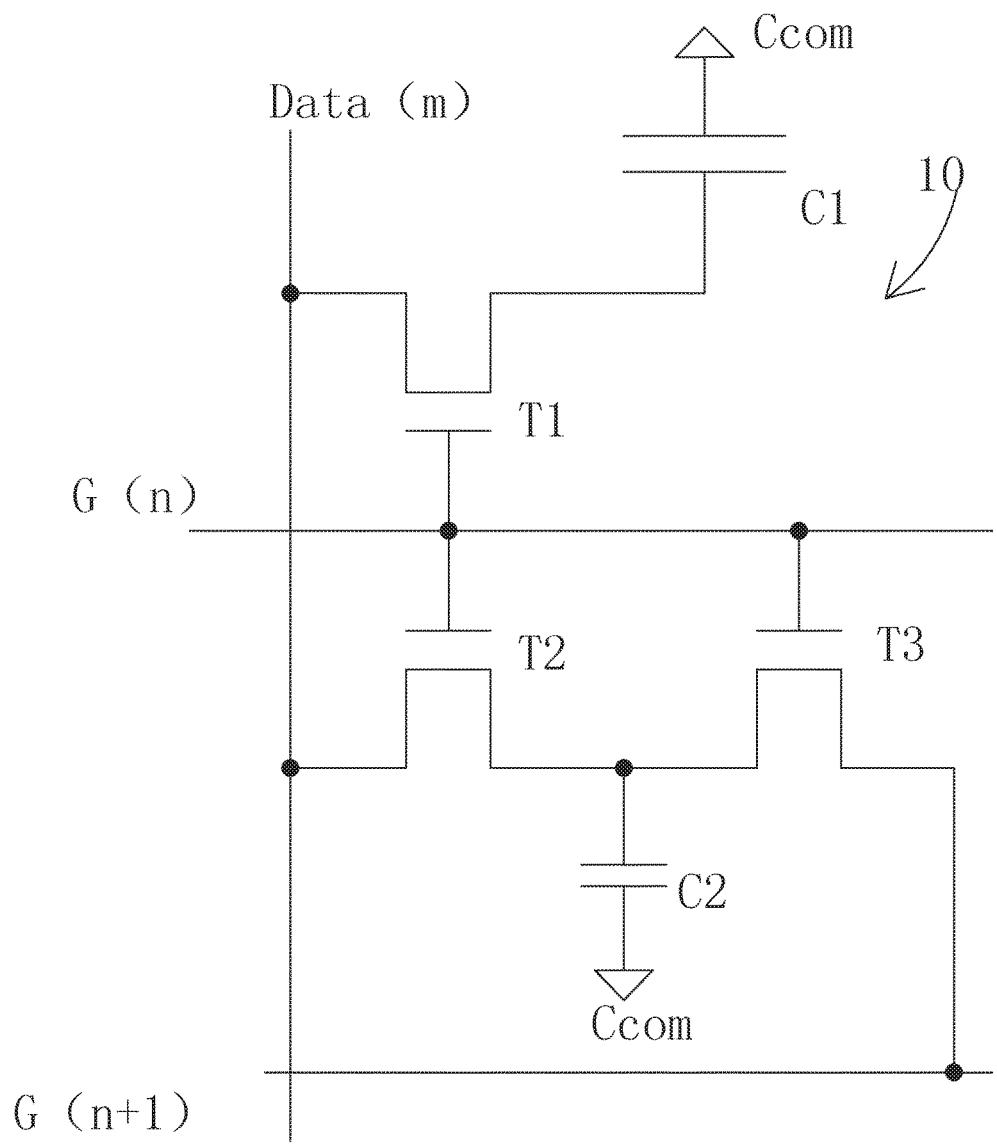
FIG. 2 is a circuit diagram of one sub pixel in a pixel unit of the present invention.
Figure 4:
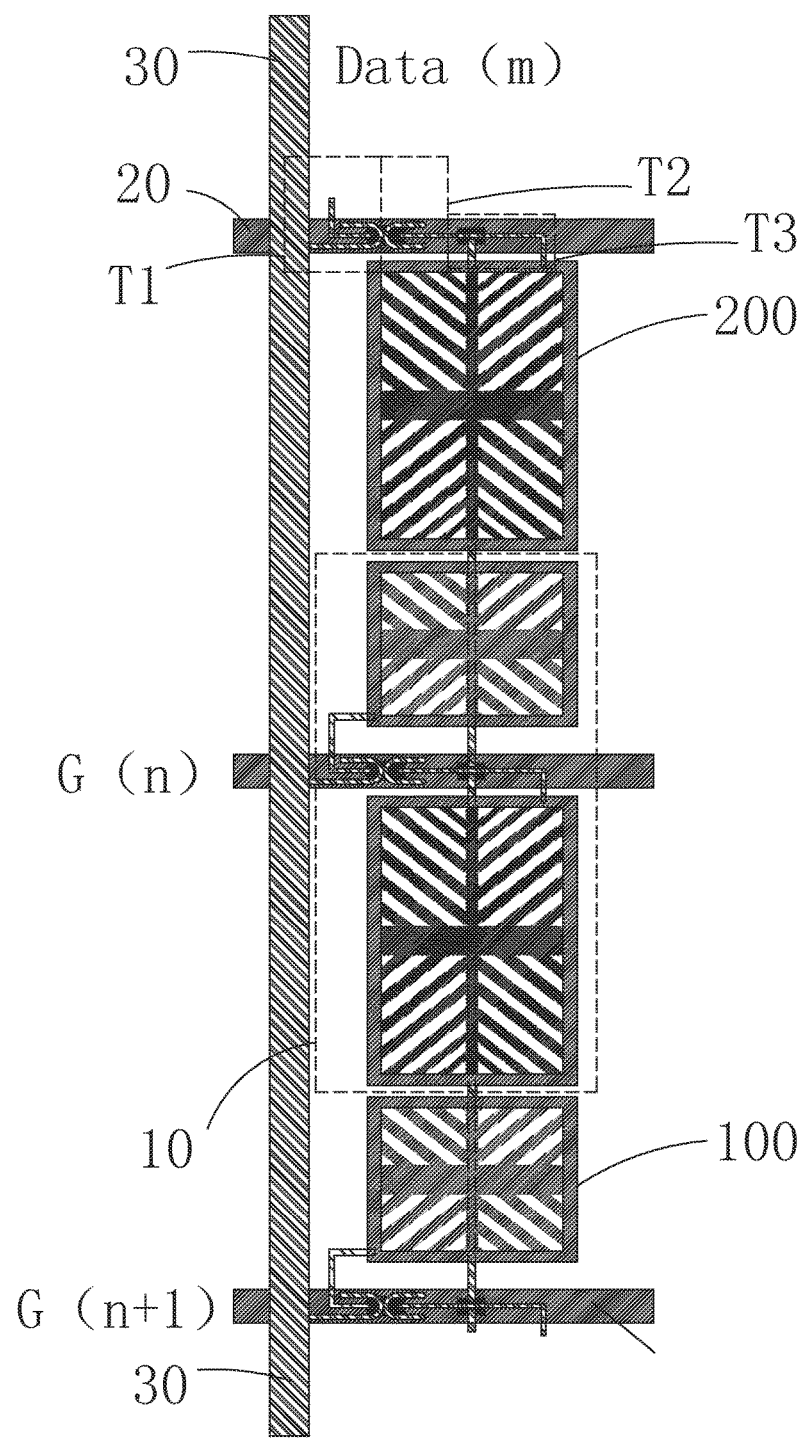
FIG. 4 is a structure diagram of a pixel unit of the present invention.

Please refer to FIG. 2 and FIG. 4. The present invention provides a pixel unit, comprising: a plurality of sub pixels 10 arranged in array, a plurality of horizontal scan lines 20 which are in parallel spaced arrangement, a plurality of vertical data lines 30 which are in parallel spaced arrangement;

wherein each row of sub pixels 10 corresponding to one scan line 20, and each column of sub pixels 10 corresponding to one data line 30, and referring to FIG. 2, each sub pixel 10 comprising: a main region thin film transistor T1, a sub region thin film transistor T2 and a charge sharing thin film transistor T3;

specifically, n and m being set to be positive integers and in the sub pixel 10 of an nth row, a mth column: a gate of the main region thin film transistor T1 being electrically coupled to a nth scan line, and a source being electrically coupled to a mth data line G(n), and a drain being electrically coupled to a main region pixel electrode 100; a gate of the sub region thin film transistor T2 being electrically coupled to the nth scan line G(n), and a source being electrically coupled to the mth data line Data(m), and a drain being electrically coupled to a sub region pixel electrode 200; a gate of the charge sharing thin film transistor T3 being electrically coupled to the nth scan line G(n), and a source being electrically coupled to a n+1th scan line G(n+1), and a drain being electrically coupled to the sub region pixel electrode 200; as the nth scan line G(n) provides a high voltage level VGH, the n+1th scan line G(n+1) providing an array substrate common voltage Acom, and rest scan lines 20 providing low voltage levels VGL.

Specifically, as shown in FIG. 4, each sub pixel 10 is divided into a main region and a sub region. An independent main region pixel electrode 100 is provided in the main region, and an independent sub pixel electrode 200 is provided in the sub region. The main region pixel electrode 100 and the color film substrate common electrode (not shown) collectively form a main region liquid crystal capacitor C1, and the sub pixel electrode 200 and the color film substrate common electrode collectively form a sub region liquid crystal capacitor C2. Namely, one end of the main region liquid crystal capacitor C1 is a main region pixel electrode 100 and the other end is a color film substrate common electrode, and one end of the sub region liquid crystal capacitor is a sub region pixel electrode 200 and the other end is the color film substrate common electrode. The color film substrate common electrode receives the color film substrate common voltage Ccom, i.e. both the other end of the main region liquid crystal capacitor C1 and the other end of the sub region liquid crystal capacitor C2 are electrically coupled to the color film substrate common voltage Ccom.

Preferably, both the main region pixel electrode 100 and the sub region pixel electrode 200 are pozidriv structures, and both materials are preferably Indium tin oxide (ITO).

Furthermore, as shown in FIG. 4, a gate of the main region thin film transistor T1, a gate of the sub region thin film transistor T2, a gate of the charge sharing thin film transistor T3 and the scan lines 20 are located in the first metal layer, and a source and a drain of the main region thin film transistor T1, a source and a drain of the sub region thin film transistor T2, a source and a drain of the charge sharing thin film transistor T3 and the data lines 30 are located in a second metal layer insulated from and stacked with the first metal layer.

Significantly, a scanning direction of the pixel unit as driving is from a first row of sub pixels 10 to a last row of sub pixels 10. Namely, the n+1th row of sub pixels 10 is scanned after the nth row of sub pixels 10.

Figure 3:
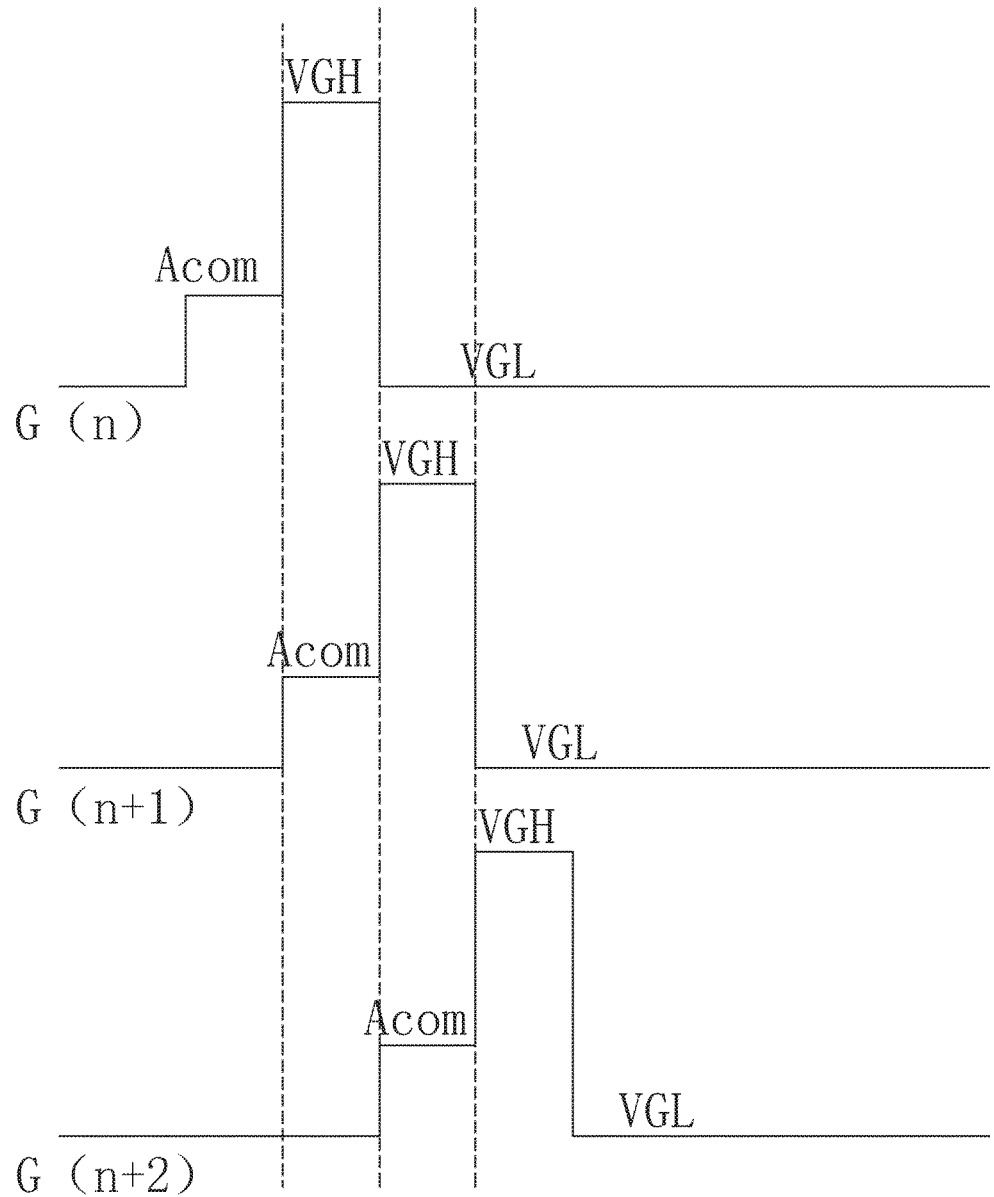
FIG. 3 is a sequence diagram of a pixel unit of the present invention.

Please refer to FIG. 2 and FIG. 3 at the same time. The working process of the pixel unit according to the present invention is: first, the nth scan line G(n) providing a high voltage level VGH, and the n+1th scan line G(n+1) providing an array substrate common voltage Acom, and rest scan lines 20 providing low voltage levels VGL, and all the main region thin film transistor T1, the sub region thin film transistor T2 and the charge sharing thin film transistor T3 in the nth row of sub pixels being activated, and the main region thin film transistor T1 charging the main region liquid crystal capacitor C1, and the sub region thin film transistor T2 charging the sub region liquid crystal capacitor C2, and the charge sharing thin film transistor T3 discharging the sub region liquid crystal capacitor C2 so that a voltage of two ends of the sub liquid crystal capacitor C2 is lower than a voltage of two ends of the main region liquid crystal capacitor C1. Then, the n+1th scan line G(n+1) providing a high voltage level VGH, and the n+2th scan line G(n+2) providing an array substrate common voltage Acom, and rest scan lines 20 providing low voltage levels VGL, and all the main region thin film transistor T1, the sub region thin film transistor T2 and the charge sharing thin film transistor T3 in the n+1th row of sub pixels being activated, and the main region thin film transistor T1 charging the main region liquid crystal capacitor C1, and the sub region thin film transistor T2 charging the sub region liquid crystal capacitor C2, and the charge sharing thin film transistor T3 discharging the sub region liquid crystal capacitor C2 so that a voltage of two ends of the sub liquid crystal capacitor C2 is lower than a voltage of two ends of the main region liquid crystal capacitor C1, and so on until the last row of sub pixels 10.

Specifically, the array substrate common voltage Acom can be set near the color filter substrate common voltage Ccom. The specific voltage values need to be adjusted according to the specific product. Meanwhile, the array substrate common voltage Acom is larger than the low voltage level VGL and smaller than the high voltage level VGH.

In the present invention, by electrically connecting the source of the charge sharing thin film transistor T3 to the scan line corresponding to the next row of sub pixels 10 of the sub pixel 10 where the charge sharing thin film transistor is and setting the voltage level of the scan line corresponding to the next row of sub pixels 10 to be the array substrate common voltage Acom when the sub pixel 10 is scanned, the main region and the sub region of the sub pixel 10 have different voltage levels. In comparison with prior art, the additional arrangement of a line of the array substrate common voltage is not required, and the number of wires in the array substrate is effectively reduced and the aperture ratio of the liquid crystal display panel is increased which facilitates the realization of the narrow frame of the liquid crystal display panel.

Please refer to FIG. 5. The present invention further provides a driving method of a pixel unit, comprising steps of:

step 1, referring to FIG. 2 and FIG. 4, providing the aforesaid pixel unit, and the specific structure being omitted here.

step 2, sequentially scanning each row of sub pixels 10;

a scan process of each row of sub pixels: setting a row number of a currently scanned row of sub pixels 10 is the nth row, and the nth scan line G(n) providing a high voltage level VGH, and the n+1th scan line G(n+1) providing an array substrate common voltage Acom, and rest scan lines 20 providing low voltage levels VGL, and all the main region thin film transistor T1, the sub region thin film transistor T2 and the charge sharing thin film transistor T3 being activated, and the main region thin film transistor T1 charging the main region liquid crystal capacitor C1, and the sub region thin film transistor T2 charging the sub region liquid crystal capacitor C2, and the charge sharing thin film transistor T3 discharging the sub region liquid crystal capacitor C2 so that a voltage of two ends of the sub liquid crystal capacitor C2 is lower than a voltage of two ends of the main region liquid crystal capacitor C1.

Specifically, as scanning, the scan is performed with a direction from a first row of sub pixels 10 to a last row of sub pixels 10. Namely, the n+1th row of sub pixels 10 is scanned after the nth row of sub pixels 10, and the voltage level of the scan line G(n+1) corresponding to the n+1th row of sub pixels 10 is the array substrate common voltage Acom when the sub pixel 10 is scanned, and the main region and the sub region of the sub pixel 10 have different voltage levels. In comparison with prior art, the additional arrangement of a line of the array substrate common voltage is not required, and the number of wires in the array substrate is effectively reduced and the aperture ratio of the liquid crystal display panel is increased which facilitates the realization of the narrow frame of the liquid crystal display panel.

Specifically, the array substrate common voltage Acom can be set near the color filter substrate common voltage Ccom. The specific voltage values need to be adjusted according to the specific product. Meanwhile, the array substrate common voltage Acom is larger than the low voltage level VGL and smaller than the high voltage level VGH.

In conclusion, the present invention provides a pixel unit. By electrically connecting the source of the charge sharing thin film transistor to the scan line corresponding to the next row of sub pixels of the sub pixel where the charge sharing thin film transistor is and setting the voltage level of the scan line corresponding to the next row of sub pixels to be the array substrate common voltage when the sub pixel is scanned, the main region and the sub region of the sub pixel have different voltage levels, and the additional arrangement of a line of the array substrate common voltage is not required. In comparison with prior art, the number of wires in the array substrate is reduced and the aperture ratio of the liquid crystal display panel is increased which facilitates the realization of the narrow frame of the liquid crystal display panel. The present invention further provides a driving method of a pixel unit, which can reduce the number of wires and the width of the frame in the array substrate and increase the aperture ratio of the liquid crystal display panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A pixel unit, comprising: a plurality of sub pixels arranged in array, a plurality of horizontal scan lines which are in parallel spaced arrangement, a plurality of vertical data lines which are in parallel spaced arrangement;

each row of sub pixels corresponding to one scan line, and each column of sub pixels corresponding to one data line, and each sub pixel comprising: a main region thin film transistor, a sub region thin film transistor and a charge sharing thin film transistor;

n and m being set to be positive integers, in the sub pixel of an nth row, a mth column: a gate of the main region thin film transistor being electrically coupled to a nth scan line, and a source being electrically coupled to a mth data line, and a drain being electrically coupled to a main region pixel electrode;

a gate of the sub region thin film transistor being electrically coupled to the nth scan line, and a source being electrically coupled to the mth data line, and a drain being electrically coupled to a sub region pixel electrode;

a gate of the charge sharing thin film transistor being electrically coupled to the nth scan line, and a source being electrically coupled to a n+1th scan line, and a drain being electrically coupled to the sub region pixel electrode;

as the nth scan line provides a high voltage level, the n+1th scan line providing an array substrate common voltage, and rest scan lines providing low voltage levels.

2. The pixel unit according to claim 1, wherein the main region pixel electrode and a color film substrate common electrode collectively constitute a main region liquid crystal capacitor;

the sub region pixel electrode and the color film substrate common electrode collectively constitute a sub region liquid crystal capacitor.

3. The pixel unit according to claim 1, wherein both the main region pixel electrode and the sub region pixel electrode are pozidriv structures, and both materials are ITO.

4. The pixel unit according to claim 1, wherein a gate of the main region thin film transistor, a gate of the sub region thin film transistor, a gate of the charge sharing thin film transistor and the scan lines are located in the first metal layer; and a source and a drain of the main region thin film transistor, a source and a drain of the sub region thin film transistor, a source and a drain of the charge sharing thin film transistor and the data lines are located in a second metal layer insulated from and stacked with the first metal layer.

5. The pixel unit according to claim 1, wherein a scanning direction of the pixel unit as driving is from a first row of sub pixels to a last row of sub pixels.

6. A driving method of a pixel unit, comprising steps of:
step 1, providing a pixel unit, comprising: a plurality of sub pixels arranged in array, a plurality of horizontal scan lines which are in parallel spaced arrangement, a plurality of vertical data lines which are in parallel spaced arrangement;

each row of sub pixels corresponding to one scan line, and each column of sub pixels corresponding to one data line, and each sub pixel comprising: a main region thin film transistor, a sub region thin film transistor, a charge sharing thin film transistor, a main region liquid crystal capacitor and a sub region liquid crystal capacitor;

n and m being set to be positive integers and in the sub pixel of an nth row, a mth column: a gate of the main region thin film transistor being electrically coupled to a nth scan line, and a source being electrically coupled to a mth data line, and a drain being electrically coupled to one end of the main region liquid crystal capacitor;

a gate of the sub region thin film transistor being electrically coupled to the nth scan line, and a source being electrically coupled to the mth data line, and a drain being electrically coupled to one end of the sub region liquid crystal capacitor;

a gate of the charge sharing thin film transistor being electrically coupled to the nth scan line, and a source being electrically coupled to a n+1th scan line, and a drain being electrically coupled to the one end of the sub region liquid crystal capacitor;

both the other end of the main region liquid crystal capacitor and the other end of the sub region liquid crystal capacitor being electrically coupled to a color filter substrate common voltage;

step 2, sequentially scanning each row of sub pixels;

a scan process of each row of sub pixels: setting a row number of a currently scanned row of sub pixels is the nth row, and the nth scan line providing a high voltage level, and the n+1th scan line providing an array substrate common voltage, and rest scan lines providing low voltage levels, and all the main region thin film transistor, the sub region thin film transistor and the charge sharing thin film transistor being activated, and the main region thin film transistor charging the main region liquid crystal capacitor, and the sub region thin film transistor charging the sub region liquid crystal capacitor, and the charge sharing thin film transistor discharging the sub region liquid crystal capacitor so that a voltage of two ends of the sub liquid crystal capacitor is lower than a voltage of two ends of the main region liquid crystal capacitor.

7. The driving method of the pixel unit according to claim 6, wherein one end of the main region liquid crystal capacitor is a main region pixel electrode and the other end is a color film substrate common electrode;

one end of the sub region liquid crystal capacitor is a sub region pixel electrode and the other end is the color film substrate common electrode.

8. The driving method of the pixel unit according to claim 7, wherein both the main region pixel electrode and the sub region pixel electrode are pozidriv structures, and both materials are ITO.

9. The driving method of the pixel unit according to claim 6, wherein a gate of the main region thin film transistor, a gate of the sub region thin film transistor, a gate of the charge sharing thin film transistor and the scan lines are located in the first metal layer, and a source and a drain of the main region thin film transistor, a source and a drain of the sub region thin film transistor, a source and a drain of the charge sharing thin film transistor and the data lines are located in a second metal layer insulated from and stacked with the first metal layer.

10. The driving method of the pixel unit according to claim 6, wherein a scanning direction of the pixel unit as driving is from a first row of sub pixels to a last row of sub pixels.

11. A driving method of a pixel unit, comprising steps of:
step 1, providing a pixel unit, comprising: a plurality of sub pixels arranged in array, a plurality of horizontal scan lines which are in parallel spaced arrangement, a plurality of vertical data lines which are in parallel spaced arrangement;

each row of sub pixels corresponding to one scan line, and each column of sub pixels corresponding to one data line, and each sub pixel comprising: a main region thin film transistor, a sub region thin film transistor, a charge sharing thin film transistor, a main region liquid crystal capacitor and a sub region liquid crystal capacitor;

n and m being set to be positive integers and in the sub pixel of an nth row, a mth column: a gate of the main region thin film transistor being electrically coupled to a nth scan line, and a source being electrically coupled to a mth data line, and a drain being electrically coupled to one end of the main region liquid crystal capacitor;

a gate of the sub region thin film transistor being electrically coupled to the nth scan line, and a source being electrically coupled to the mth data line, and a drain being electrically coupled to one end of the sub region liquid crystal capacitor;

a gate of the charge sharing thin film transistor being electrically coupled to the nth scan line, and a source being electrically coupled to a n+1th scan line, and a drain being electrically coupled to the one end of the sub region liquid crystal capacitor;

both the other end of the main region liquid crystal capacitor and the other end of the sub region liquid crystal capacitor being electrically coupled to a color filter substrate common voltage;

step 2, sequentially scanning each row of sub pixels;

a scan process of each row of sub pixels: setting a row number of a currently scanned row of sub pixels is the nth row, and the nth scan line providing a high voltage level, and the n+1th scan line providing an array substrate common voltage, and rest scan lines providing low voltage levels, and all the main region thin film transistor, the sub region thin film transistor and the charge sharing thin film transistor being activated, and the main region thin film transistor charging the main region liquid crystal capacitor, and the sub region thin film transistor charging the sub region liquid crystal capacitor, and the charge sharing thin film transistor discharging the sub region liquid crystal capacitor so that a voltage of two ends of the sub liquid crystal capacitor is lower than a voltage of two ends of the main region liquid crystal capacitor;

wherein one end of the main region liquid crystal capacitor is a main region pixel electrode and the other end is a color film substrate common electrode;

one end of the sub region liquid crystal capacitor is a sub region pixel electrode and the other end is the color film substrate common electrode;

wherein a scanning direction of the pixel unit as driving is from a first row of sub pixels to a last row of sub pixels.

12. The driving method of the pixel unit according to claim 11, wherein both the main region pixel electrode and the sub region pixel electrode are pozidriv structures, and both materials are ITO.

13. The driving method of the pixel unit according to claim 11, wherein a gate of the main region thin film transistor, a gate of the sub region thin film transistor, a gate of the charge sharing thin film transistor and the scan lines are located in the first metal layer, and a source and a drain of the main region thin film transistor, a source and a drain of the sub region thin film transistor, a source and a drain of the charge sharing thin film transistor and the data lines are located in a second metal layer insulated from and stacked with the first metal layer.

* * * * *